United States Patent
Cho et al.

(10) Patent No.: US 10,830,800 B1
(45) Date of Patent: Nov. 10, 2020

(54) SUBCIRCUIT PHYSICAL LEVEL POWER MONITORING TECHNOLOGY FOR REAL-TIME HARDWARE SYSTEMS AND SIMULATORS

(71) Applicant: University of Southern California, Los Angeles, CA (US)

(72) Inventors: Young H. Cho, Chatsworth, CA (US); Siddharth S. Bhargav, Los Angeles, CA (US)

(73) Assignee: University of Southern California, Los Angeles, CA (US)

(*) Notice: Subject to any disclaimer, the term of this patent is extended or adjusted under 35 U.S.C. 154(b) by 0 days.

(21) Appl. No.: 16/537,433

(22) Filed: Aug. 9, 2019

Related U.S. Application Data (62) Division of application No. 15/173,566, filed on Jun. 3, 2016, now Pat. No. 10,386,395.

(Continued)

(51) Int. Cl.
  G01R 22/00 (2006.01)
  G06F 17/00 (2019.01)
  G01R 21/133 (2006.01)

(52) U.S. Cl.
  CPC .................. G01R 21/133 (2013.01)

(58) Field of Classification Search
  CPC ..................................................... G01R 21/133
  See application file for complete search history.

(56) References Cited

U.S. PATENT DOCUMENTS 6,021,381 A  2/2000  Ohnishi
6,167,303 A  12/2000  Thomson
(Continued)

FOREIGN PATENT DOCUMENTS

JP  10-154172  6/1998
KR  10-2011-009128  8/2011

OTHER PUBLICATIONS

Anderson et al., "Power Estimation Techniques for FPGAs", IEEE Transactions on Very Large Scale Integration (VLSI) Systems, vol. 12, No. 10, Oct. 2004, pp. 1015-1027.
(Continued)

*Primary Examiner* — Mohammad K Islam
(74) *Attorney, Agent, or Firm* — Fish & Richardson P.C.

(57) ABSTRACT

In at least one aspect, a system is configured to use a mapping to determine per-component dynamic power consumed by components in a SoC during execution of instructions, the mapping translating consumed power per one or more instructions into consumed power per component based on a set of determined components (an adjusted set of proposed components) and derived weights, the set of proposed components having been generated to represent the components of the SoC and including a respective proposed component corresponding to each instruction, and the set of proposed components having been adjusted based on the derived weights being produced for the set of proposed components by at least combining two or more proposed components associated with two or more of the derived weights that converged to a shared value, and perform power and temperature management for the SoC in accordance with the determined per-component dynamic power consumption.

18 Claims, 6 Drawing Sheets

Related U.S. Application Data (60) Provisional application No. 62/170,256, filed on Jun. 3, 2015.

(56) References Cited

U.S. PATENT DOCUMENTS

| | | | | |
|---|---|---|---|---|
| 6,301,184 | B1 | 10/2001 | Sasaki | |
| 7,460,965 | B2 | 12/2008 | Saeki et al. | |
| 7,756,654 | B2 | 7/2010 | Yamamoto et al. | |
| 9,618,547 | B2* | 4/2017 | Cho | G01R 22/00 |
| 10,151,786 | B2* | 12/2018 | Jain | G01R 31/50 |
| 10,345,882 | B2* | 7/2019 | Wen | G06F 1/3203 |
| 10,409,936 | B2* | 9/2019 | Park | G06F 30/367 |
| 2004/0128567 | A1* | 7/2004 | Stewart | G06F 1/324 713/300 |
| 2005/0034089 | A1 | 2/2005 | McGuffin | |
| 2006/0250843 | A1 | 11/2006 | Bertin | |
| 2008/0092092 | A1 | 4/2008 | Dalton et al. | |
| 2009/0259869 | A1 | 10/2009 | Naffziger | |
| 2011/0078478 | A1* | 3/2011 | Branover | G06F 1/3203 713/323 |
| 2011/0288793 | A1 | 11/2011 | Sanchez-Loureda et al. | |
| 2012/0095737 | A1 | 4/2012 | Sasaki | |
| 2013/0093186 | A1* | 4/2013 | Arinaga | H02J 3/381 290/44 |
| 2013/0191054 | A1 | 7/2013 | Cho | |
| 2014/0223404 | A1* | 8/2014 | Gupta | G06F 30/398 716/133 |
| 2014/0316731 | A1* | 10/2014 | Singh | H01L 22/20 702/82 |
| 2014/0331069 | A1* | 11/2014 | Branover | G06F 1/26 713/340 |
| 2015/0277521 | A1* | 10/2015 | Jain | G06F 1/3225 713/300 |
| 2017/0108917 | A1* | 4/2017 | Lee | G06F 13/364 |

OTHER PUBLICATIONS

Bhargav et al., "Accelerating Physical Level Sub-Component Power Simulation by Online Power Partioning", 2016 17th International Symposium on Quality Electronic Design (ISQED), IEEE, pp. 221-226, 2016.

Bhargav et al., "Accurate In-Situ Runtime Measurement of Energy per Operation of System-on-Chip on FPGA", 2015 International Conference on ReConFigurable Computing and FPGAs (ReConFig), IEEE, pp. 1-8, 2015.

Bhargav et al., "Measuring Power Digitally with Numerical Analysis", 2012.

Bernstein et al., "High-performance CMOS variability in the 65-nm regime and beyond", IBM J. Res. & Dev., vol. 50, No. 4/5, Jul./Sep. 2006, pp. 443-449.

Bryant, "Graph-Based Algorithms for Boolean Function Manipulation", IEEE Transactions on Computers, C-35(8), 1986, pp. 677-691.

Buyukasahin et al., "Early Power Estimation for VLSI Circuits", IEEE Transactions on Computer-Aided Design of integrated circuits and systems, vol. 24, 2005, pp. 1078-1088.

Gupta et al., "Power Modeling for high-Level Power Estimation", IEEE Transactions on Very large Scale Integration (VLSI) Systems, vol. 8, No. 1, Feb. 2000, pp. 18-29.

Najm, "Transition Density, A New Measure of Activity in Digital Circuits", IEEE Transactions on Computer-Aided Design of Integrated Circuits and Systems, vol. 12, Feb. 1993, pp. 310-323.

Pedram et al., Power Aware Design Methodologies, Kluwer Academic Publishers, 2002, pp. 245-249, 256, 259-260, 279-281, 421-443.

Rabaey et al., Digital Integrated Circuits: A Design Perspective, Pearson Education (2003), Item No. 0130909963, pp. 30-31, 99, 101.

\* cited by examiner

SUBCIRCUIT PHYSICAL LEVEL POWER MONITORING TECHNOLOGY FOR REAL-TIME HARDWARE SYSTEMS AND SIMULATORS

CROSS-REFERENCE TO RELATED APPLICATIONS

This application is a divisional of and claims the benefit of U.S. patent application Ser. No. 15/173,566, filed Jun. 3, 2016 and issued on Aug. 20, 2019 as U.S. Pat. No. 10,386,395, which claims the benefit under 35 U.S.C. § 119(e) of U.S. Patent Application No. 62/170,256, filed Jun. 3, 2015, which are incorporated herein by reference in their entirety.

This application is related to U.S. patent application Ser. No. 13/719,916 entitled "DIGITAL CIRCUIT POWER MEASUREMENTS USING NUMERICAL ANALYSIS", filed Dec. 19, 2012 and published on Jul. 25, 2013 as US Pub. No. 2013/0191054, which is incorporated herein by reference in its entirety.

STATEMENT AS TO FEDERALLY-SPONSORED RESERACH

This invention was made with government support under Contract No. CNS 0905596 and No. IIP 1212397, awarded by the National Science Foundation (NSF). The government has certain rights in the invention.

BACKGROUND

This specification relates to power/thermal characterization and power monitoring for subcircuits of real-time hardware systems and simulated systems.

Simulation of large circuits for smart power management has seen some improvements through application specific designs. However, power and temperature limits were reached over a decade ago. Worsening integrated circuit (IC) yield problems are affected by power, where parts of the chip may overheat.

Despite advances in IC manufacturing and computer architecture, the performance of digital systems has plateaued over several generations of technologies. This behavior is attributed to overheating caused by excessive on-chip power dissipation. The overheating is mainly due to inability of cooling systems to cope with demands of increased logic density in modern day digital systems.

SUMMARY

This specification relates to power/thermal characterization and power monitoring for subcircuits of real-time hardware systems and simulated systems.

In general, one or more aspects of the subject matter described in this specification can be embodied in one or more methods that include: receiving a total static power indicating a static power dissipation from a complete circuit, wherein the circuit comprises a plurality of components; receiving dynamic power weights indicating changes in the static power dissipation from the complete circuit over time; applying an algorithm including the dynamic power weights to partition the total static power, based on the changes in the static power, into a summation of individual per-component static power values, wherein the per-component static power values indicate a decomposition of the static power dissipation from the complete circuit into separate amounts of per-component static power dissipation corresponding to each of the plurality of components; and processing the per-component static power to evaluate a performance of the circuit, the plurality of components, or both.

In general, one or more aspects of the subject matter described in this specification can be embodied in one or more systems that include: a circuit board for mounting an integrated circuit (IC) chip; and a computing device coupled with the circuit board and programmed to (i) generate a bit file corresponding to a chip testing operation, wherein the bit file is usable by a chip testing program in executing and controlling the chip testing operation, (ii) load the bit file to the IC chip to implement the testing operation, wherein implementing the testing operation comprises collecting profile data that is indicative of a dynamic power consumption for the IC chip based on an instruction count associated with instructions of the testing operation executed by the IC chip and further based on dynamic power weights (iii) store the collected profile data and the instruction count corresponding to each of the executed instructions, (iv) generate one or more profiles based on the profile data and the dynamic power estimation, wherein the one or more profiles are usable by the chip testing program to evaluate a performance of the IC chip, and (v) generate an additional one or more profiles of one or more configuration of layouts of the IC chip to provide feedback on the dynamic power consumption.

In general, one or more aspects of the subject matter described in this specification can be embodied in one or more methods that include: receiving a design descriptor for circuitry, wherein the design descriptor is specified at a gate-level indicating logic gate components and inputs of the circuitry; generating input patterns comprising simulation vector inputs, wherein the simulation vector inputs are usable to exercise each of the logic gate components and inputs of the circuitry during a simulation; analyzing the design descriptor to determine one or more observability points within the circuitry, wherein the one or more observability points are usable in measuring an amount of power consumption corresponding to a logic gate circuitry and observing signal transitions corresponding to an input of the circuitry; providing the one or more observability points and the input patterns to a model based simulator to generate model based simulation results associated with a simulated behavior of the circuitry during the simulation; applying a power weights extractor to the model based simulation results and the design descriptor to calculate power weights, wherein the power weights indicate amounts of power consumption corresponding to respective logic gate components of the circuitry based on the simulated behavior of the circuitry; partitioning the design descriptor to generate a subset of circuitry, wherein the subset of circuitry comprises a portion of the logic gate components and inputs of the circuitry; providing the subset of circuitry and the power weights to a power simulator to perform an estimation of power consumed by the circuitry; and partitioning the estimated power consumption to subcomponents of power consumption logic gates.

Particular embodiments of the subject matter described in this specification can be implemented to realize one or more of the following advantages. The systems and techniques described can realize advantages associated with providing detailed and accurate heat dissipation maps for physical circuits, performing dynamic power and static power monitoring, and profiles generated post-packaging to account for manufacturing process variation. The power/thermal profiling system and techniques support various IC chip power management applications, such as: management of hotspot information, management of power dissipation, optimization of performance/power, increase of overall IC yield, reduction of chip failures, enhancement of system layout decisions, and improvement on design synthesis, and manufacturing of circuits. The accelerated power simulator system and techniques implement a power simulator with increased speed (e.g., 24-40 time speedup) while maintaining high accuracy. Significant performance advantages may be realized as the accelerated power simulator of some embodiments requires less memory usage (e.g., less than $\frac{1}{50}^{th}$) than some existing simulator technologies. The power/thermal monitoring techniques described utilize hardware and software aspects that improve existing technologies employing either exclusively modeling through simulation (e.g., high inaccuracies) or measuring through randomized placement of thermal sensors (e.g., high inaccuracies).

The systems and techniques described can determine power dissipation as it correlates to transitions that occur within the physical components and subcircuits of an IC. Accordingly, the techniques provide a power monitoring solution that has dynamics more similar to direct analog-to-digital (ADC) instrumentation and more closely represents the architectural components of circuits. The embodiments employ regression and switching theory of transistors at gate level, and thereby implements a monitoring technique that can be scaled for use with circuit configurations including a few gates to many gates. The power partitioning techniques described consider multiple components of circuit power consumption (e.g., noise, dynamic, static), and measures static power (rather than static power simulation), and thereby improves accuracy. The techniques described utilize runtime self-calibration, and may realize circuit designs that are less vulnerable to process-voltage-temperature (PVT) variations.

The details of one or more embodiments of the subject matter described in this specification are set forth in the accompanying drawings and the description below. Other features, aspects, and advantages of the invention will become apparent from the description, the drawings, and the claims.

DRAWING DESCRIPTIONS

Like reference numbers and designations in the various drawings indicate like elements.

DETAILED DESCRIPTION

Figure 1:
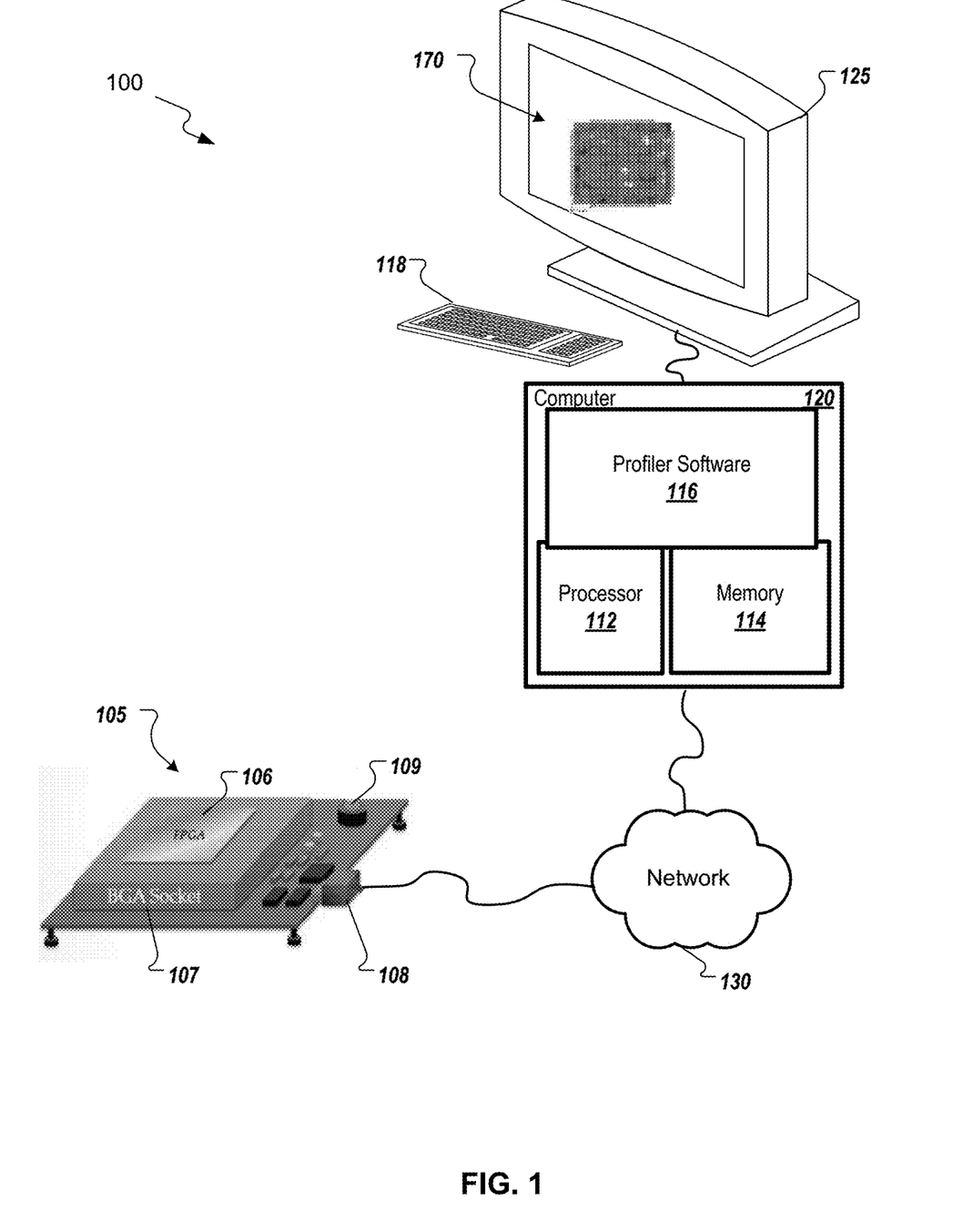
FIG. 1 shows an example of a power/thermal profiling system employed to measure, analyze, and evaluate power and/or temperature of an integrated circuit.

FIG. 1 is an example of a power/thermal profiling system 100 employed to measure, analyze, and evaluate the power and/or temperature dissipation in various parts, or sub-circuits, of an integrated circuit (IC) chip 106. According to the embodiments, the power/thermal profiling system 100 can be employed to support various IC-based power and temperature management functions, including but not limited to: managing hotspot information; managing power dissipation; optimizing performance/power; increasing overall IC yield; reducing chip failures; enhancing system layout decisions; and improving circuit development (e.g., logic design, synthesis, and manufacturing). As illustrated in FIG. 1, the system integrates various hardware, software, and firmware components that operate in concert to accomplish the power/thermal profiling techniques of the embodiments.

The power/thermal profiling system 100 can include a compact printed circuit board (PCB) 105 used to physically mount an IC chip 106 for subsequent power profiling. In an example, the IC chip 106 is a circuit capable of being configured for a specific implementation after manufacturing or fabrication of the chip, such as field-programmable array (FPGA). According to the embodiments, a PCB 105 can include conductive traces that electrically connect the various connectors and components of the profiler to each other, and pads that are a portion of exposed metal on the surface to which a component can be received or otherwise mounted. Thus, the PCB 105 can allow signals and power to be routed to the various components, and namely the circuitry of the connected IC chip 106. As an example, the PCB 105 provides connections and input terminals that are arranged to receive and electrically connect various hardware components of the profiler, as illustrated in FIG. 1, including the data interface 108, input/output controls (e.g., push buttons) 109, and chip interface 107. The chip interface 107 can be a device including a plurality of interconnection pins, and used as a surface-mounting packaging (e.g., chip carrier) for an IC chip 106 in connecting the chip to the board without directly or permanently attaching it to the PCB 105. Therefore, the chip interface 107 can provide a reusable interface between an IC chip 106 and PCB 105 in instances where the chip may need to be removed or replaced, such as in a testing environment. In an embodiment, the chip interface 107 is implemented as a ball grid array (BGA) socket.

The computer 120 includes a processor 112 and a memory 114, and the computer 120 can be connected to a computer network 130, which can be a private network, a public network, a virtual private network, etc. The computer network 130 can be implemented as either a wired network (e.g., Ethernet) or a wireless network. The various devices of system 100, including PCB 105 and computer 120, can be connected via network 130. Examples of computer networks include, but are not limited to, a local area network (LAN), a wide area network (WAN), and the Internet. As shown in FIG. 1, the computer network 130 is a wired network so that the PCB 105 can communicate, or otherwise transmit, data via data interface 108 implemented as physical connections such as Universal Serial Bus (USB) connectors. Alternatively, the devices can utilize a direct physical connection that does not necessitate using the network 130. In some implementations, computer network 130 can be a wireless local area network (WLAN), such as an IEEE 802.n network. Thus, PCB 105 and computer 120, for example, are communicatively coupled, and capable of wireless transmission of data via the computer network 130.

The processor 112 can be one or more hardware processors, which can each include multiple processor cores. The memory 114 can include both volatile and non-volatile memory, such as Random Access Memory (RAM) and Flash RAM. The computer 120 can include various types of computer storage media and devices, which can include the memory 114, to store instructions of programs that run on the processor 112.

Such programs can include Profiler Software 116, which can run locally on computer 120, remotely on a computer of one or more remote computer systems (e.g., in a third party provider's server system accessible by the computer 120 via the network 130), or on a combination of one or more of each of the preceding. The Profile Software 116 can present a user interface (UI) employed for displaying, or otherwise rendering, visual representations of power/thermal characterizations of an IC chip, such as a physical die (e.g., on-chip) temperature profiler 170 on a display device 125 of the computer 120. The display device 125 can be operated using one or more input devices 118 of the computer 120 (e.g., keyboard and mouse or touch screen). Note that while shown as separate devices in FIG. 1, the display device 125 and/or input devices 118 can also be integrated with each other and/or with the computer 120, such as in a tablet computer.

The Profiler Software 116 is configured to analyze, process, and manipulate the data associated with the IC chip 106, that is generated using power/energy/temperature measuring techniques of the embodiments. The Profiler Software 116 can implement various capabilities of the system, including but not limited to: tester designer generator for FPGA models; test system controller and data collection; subcomponent level power profiler; component to physical layout mapper; physical die temperature profiler; multiple layout template generator; profile based optimal bitfile selector. In some implementations, the Profiler Software 116 further implements chip specific constraint file generation.

Additionally, the intellectual property (IP) core of the IC chip 106 can include firmware to implement some software aspects of the power/thermal profiling techniques of the embodiments. A plurality of tester design bitfiles used for configuring particular test operations of the IC chip 106 can be implemented as firmware. Moreover, the Profiler Software 116 can include a profile based bitfile/firmware selector, which can be a tool usable with mass produced IC chips, or FPGA based products. The bitfile/firmware selector aspects of the Profiler Software 116 can be employed to: generate multiple bitfiles of the same design, perform multiple power/heat profile generation, select a most suitable bitfile using output from the profiler itself as a consideration, and perform accurate characterization of a bitfile, for example. As an example, the IP chip 106 can be configured to implement an experimental circuit, in accordance with a selected bitfile. Thereafter, the computer 120 can initiate a testing application using Profile Software 116, for instance, which runs a test on the circuitry of IP chip 160 at 200 MHz, for example. Results, such as heat dissipation measurements, can be extracted from the IP chip 106 based on the function of components and subcircuits, and used to analyze the performance and power/thermal characteristics of the IP chip 106.

The Profile Software 116 is designed to implement the particular power and/or energy measurement techniques described herein. In an implementation, the Profiler Software 116 implements and controls total power measurement methods for evaluating an IC chip 106. The total power measurement techniques can include algorithms for computing energy per instruction (EPI) and energy per component (EPC). Software loaded on the IC chip 106, or microprocessor, can be utilized to implement the EPI and EPC power monitoring methods, and thereby allows for accurate microprocessor power measurement without any additional hardware. EPI is an estimate or measurement of the energy dissipated by a processor when it executes a particular instruction. Given an accurate EPI, the power dissipated by a sequence of instructions (processor thread) can be calculated (or predicted). Some existing EPI techniques have been used to design energy or power aware compilers, however the EPI values have been estimates based on simulations of processor designs, as opposed to measurements. The power monitoring techniques described can estimate power with high accuracy for the EPI for a particular processor, that is process-variation independent. To estimate the EPI, an online math analysis technique over a sequence of linear equations formed by instruction counts and total measured power can be used.

Long kernels (programs) are created that contain a mix of instructions covering as much as the instruction set architecture as possible for a given processor. Then these kernels are run while collecting power measurements. The number of each instruction found in the kernel becomes the counts for the linear equations (each component of the equation representing EPI and instruction counts) and the power dissipated by each instruction (EPI) becomes the unknowns. Given a short duration of processor execution and collection of instruction histogram over the execution, the component analysis algorithm (regression methods, statistical analysis, and independent component analysis) will produce converged EPI to the instructions.

Additionally, EPI can be further extended to calculate the EPC, or Energy per Component of each sub-component of the CPU. In order to do this, processor architecture can have a relationship of correspondence with the instructions. This can be a mapping process that converts instruction counts into micro architectural component activation counts. These component counts can be used within the linear equation. The EPC methodology can be complementary to in-situ counters.

Total energy consumption of the IC, for example a system-on-chip (SoC) can be based on the fundamentals of CMOS circuit switching. For instance, the total energy consists of dynamic and static energy. The dynamic energy depends on circuit switching activity and can be further decomposed into energy due to capacitive switching and the crowbar current. The static energy dissipation is considered to be based primarily on leakage current. Observing switching activity at every gate of the system can result in an accurate measurement of dynamic energy of these components at finest granularity.

Also, static energy can be measured at the voltage supply rail of these circuits based on the input patterns applied. However, it may be infeasible to implement such a system due to impractical implementation overheads, and therefore the power monitor techniques of the embodiments monitor subcircuits by characterizing the activities to estimate dynamic and static energy with minimal loss in accuracy. Measuring the total energy can be accomplished and further correlating it with the characterization of the circuit activity within the SoC, per instruction for example.

The per-instruction energy/power measurement techniques of the embodiments can use digital hardware sensors and/or software monitoring mechanism as underlying instrumentation for partitioning the precise dynamic and static power for subcircuits within the digital logic designs, for example. The total power measurements can be collected in conjunction with digital sensor information to enable calibration of the system, using an implementation with minimal extra hardware overhead.

Figure 2A:
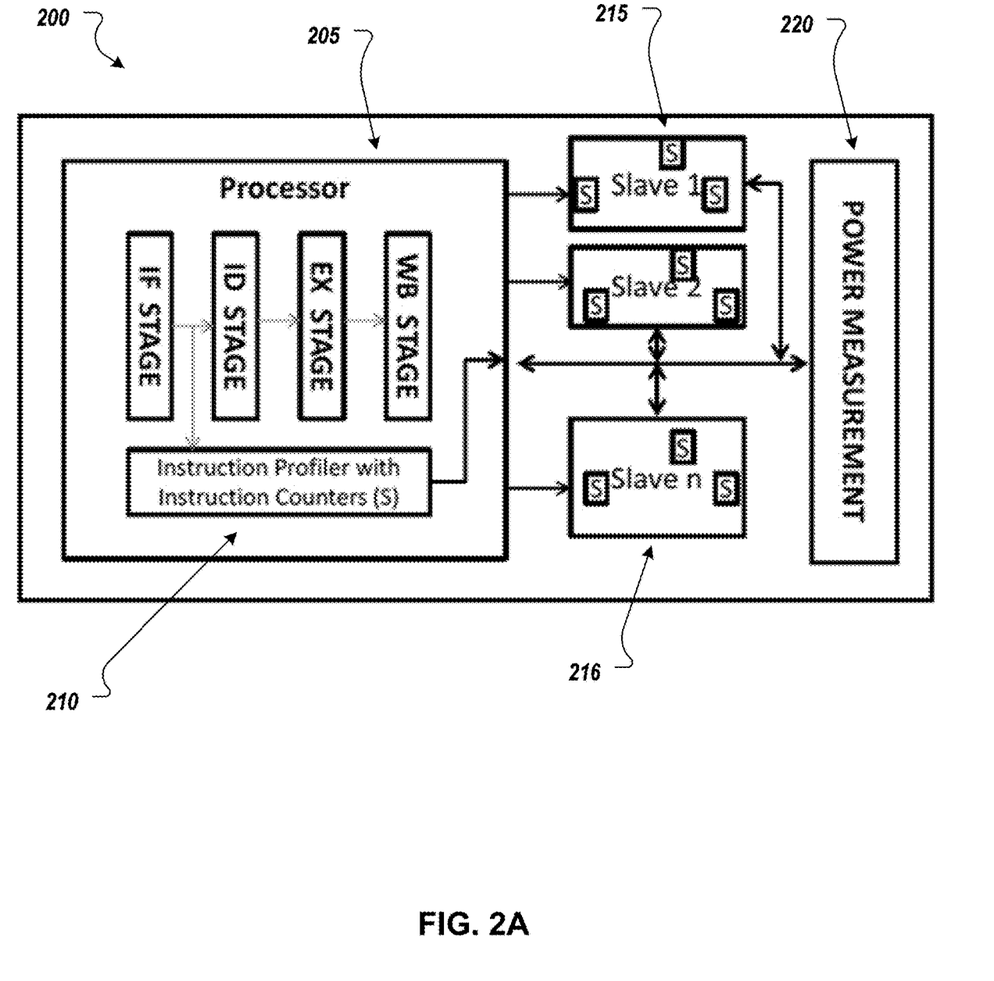
FIG. 2A shows an example of an instruction profiler that can be employed in the power measurement techniques described.

FIG. 2A shows an example of an instruction profiler that can be employed in the power measurement systems and techniques described. The instruction profiler 200 can include hardware, for example implemented on processor 205, and be configured to use instructions or control signals that drive the logic on an IC chip. Furthermore, the instruction profiler 200 can match patterns temporally and be further employed to measure power. In an implementation, an instruction profiler is utilized that matches each instruction and increments a counter 210. These instructions counts can be used for all subsequent power calculations. Power measurements at finer granularity can be done to capture per-component energy by mapping each of these instructions with the components it activates over time. An instruction counter 210 associated with each component is incremented based on the instruction executed. These counts of instructions from instruction counter 210 can be then used as parameters to the algorithm employed in measuring dynamic power dissipated as each instruction is executed. One or more sensors 215 can be located on each component of interest 216 to measure power and/or energy dissipation. These values are then used by the power management unit 220 to extract dynamic and static power in real-time. Additionally, logic gate-level sensor instrumentation can be employed, which captures digital activities of each component of interest. Thus, the activity of each component can be captured spatially and used to measure power at any instant of time. In some embodiments, a hybrid technique that involves aspects of both instruction and logic-gate level sensors is used to capture processor interactions separately as a component and all other measurements can be performed using the temporal measurement technique.

According to the embodiments, each instruction has a limited or unique datapath within a given processor architecture. Therefore, an analysis can be performed to determine the datapath of each instruction through a given processor architecture. During this process, various components in software are included such that on every instruction issue, the instruction can be mapped to power consumed over the chip layout, or floorplan.

For each instruction, the instruction profiler 200 can map the instruction into a known set of hardware components. Further, associated components can be incremented for each instructions executed, where these numbers can be used in an algorithm to extract weights. Once the mapping of instructions to component activity is completed, the instruction profile over sample time that is defined in hardware or software can be converted to number of execution of each component in the hardware. For instance, an "ADDI" instruction count N over a sample time can be converted to an accumulation of N to multiple components within its datapath, such as Program Counter, ALU, Rgsiterfile, Pipeline Registers, and a number of multiplexers. The converted component based activity values can be used as parameters in the algorithm employed to extract accurate component wise power values.

In some implementations, utilization of each architectural component of the processor can be used to extract energy per-component per-instruction. Utilization counts for analysis of extract energy per component of the embedded processor can be recoded. The rate of usage of a component is proportional to its power consumption. Therefore, the per-component utilization counts along with total power measurement can be used as an input to online regression algorithm to extract component specific weights. These weights indicate component specific dynamic energy and a lumped average static energy component of the processor. Once the weights are converged, these can be used towards subsequent energy estimation of the processor. Additional details regarding linear regression algorithms, weight extraction, and dynamic power partitioning are described in U.S. patent application Ser. No. 13/719,916 entitled "DIGITAL CIRCUIT POWER MEASUREMENTS USING NUMERICAL ANALYSIS", filed Dec. 19, 2012 and published on Jul. 25, 2013 as US Pub. No. 2013/0191054, which is incorporated herein by reference in its entirety. Thus, the instruction profiler 200 can be employed to evaluate a dynamic power estimation at a per-instruction level using similar techniques previously described in determining dynamic power for subcircuits.

To profile every instruction executed on a processor, for example an OpenRISC processor, identifying various architectural components activated by the processor such as ALU, Control Unit can be performed. Those instructions can be decomposed into various components hierarchically, and the decomposition can continue until the desired accuracy is reached. The set of supported instructions can be divided based on its operation; for example, classify instructions using Load Store unit as one group. This type of classification can result in seven groups for the initial decomposition of an instruction set architecture (ISA) of the current OpenRISC architecture, for example. The seven instruction groups can be ALU, Multiply-and-Accumulate, Shift-Rotate, Branch, Load-Store, Compare and Floating Point Operations. These components can attribute to a larger contribution of power usage when an associated instruction activates it during execution.

Furthermore, based on the desired accuracy, these sets of components can be further decomposed by identifying differences between the instructions within a specific group. Using the changes covered during the previous decomposition, additional sub-components can be identified during a current decomposition to compensate for any unaccounted differences. The sub-components found in the current decomposition are then associated with the differences between the instructions. The error due to differences between instructions having similar component usage profile can be compensated by subsequent decomposition of components usage. The error could stem from differences in instruction execution paths (e.g., jump instructions) and usage of each component (e.g., changes in input patterns to ALU and memory in add, sub instructions). Thus, a mapping template can be generated as used by the processor to convert the hardware instruction counts into component counts to estimate energy at a desired accuracy. Using the component counts from the mapping, the component utilization for any program running on a CPU can be employed to estimate energy consumption in-situ and at low latency.

Figure 2B:
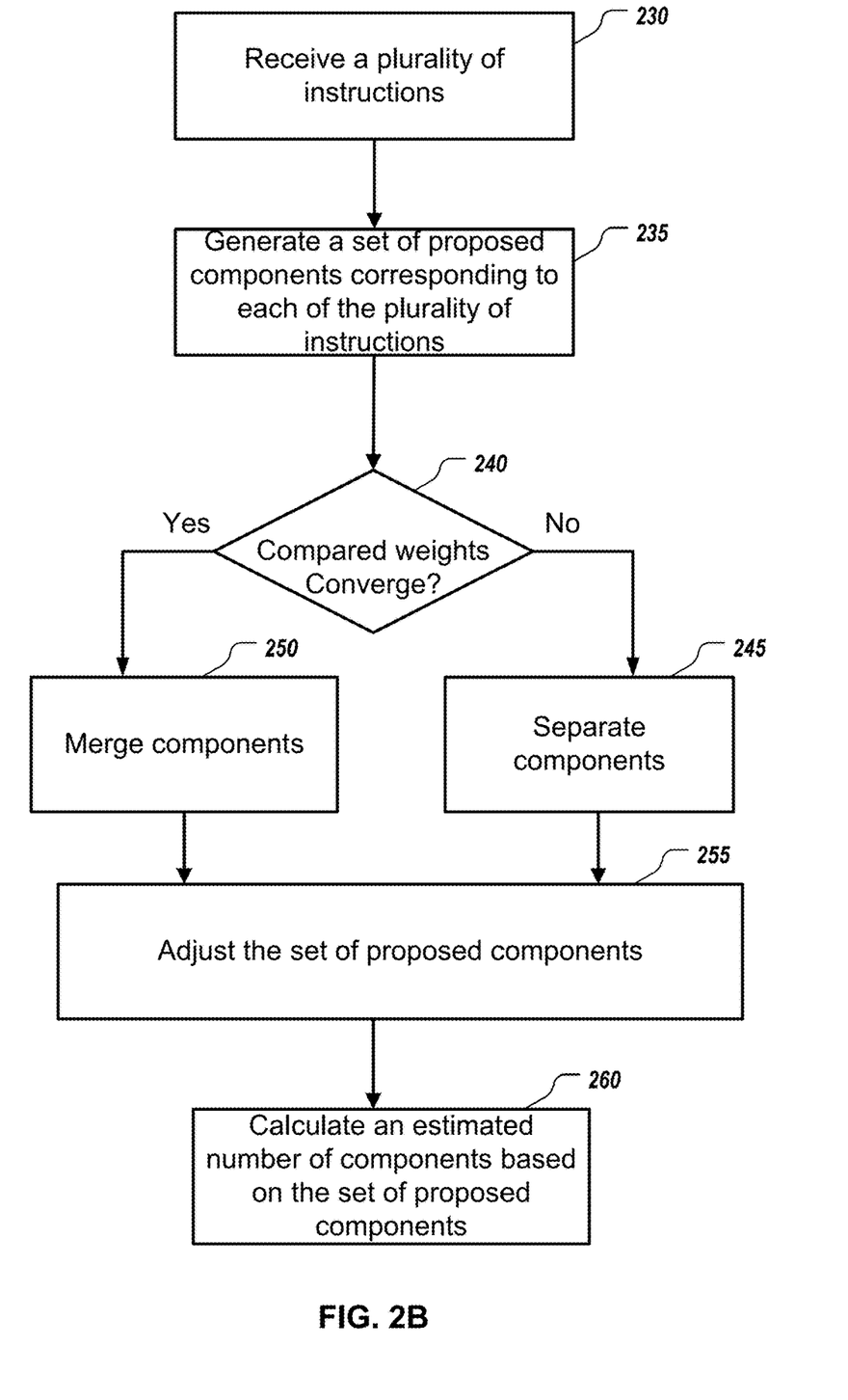
FIG. 2B shows an example of a process employed for mapping instructions to components of a circuit.

In some implementations, a process can be employed to automatically convert, or otherwise map, instructions executed by a processor circuit to components of that circuit, with the physical component layout of the circuit being unknown. In the process, extracting weights per component for a list of proposed components that are assume initially and then pruned based on the weights to find the underlying components, or an estimated number of components. As shown in FIG. 2B, the process begins with receiving a plurality of instructions 230, for example an instruction set used to perform power monitoring for a circuit. In some embodiments, it is initially assumed that:

$\forall n$ instructions of the system $\exists 1$ unique component and $(n-1)$ shared components–per instruction Meaning that an instruction is defined as a unique command to a processor or any distinguishable signal or set of signals within a given logic that performs an activity within the logic and dissipates power/energy.

Accordingly, a set of proposed components is generated 235, where the proposed components can be conceptual, or pseudo-components, used to represent physical components that can be present in the circuit architecture in estimating a component count based on the circuit activity. In some implementations, generating the set of proposed components can involve creating a proposed component corresponding to each instruction present in the instruction set (e.g., 1 instruction-to −1 proposed component). Initially the number on proposed components in the instruction set can be equal to number of instructions, or instruction count, received in the instruction set. For example, if an ISA has 80 instructions, then for each instruction we initially assume 1 unique component and 79 shared components. In some implementations, generating the instruction set further assumes that the shared component C is activated when either instruction j or k is executed irrespective of the order of execution. That can be expressed as:

∀ The sharing of a component $C$ between a $j^{th}$ and $e^{th}$ instruction is commutative. or Instruction $(j) \leftrightarrow$ instruction $(k) \rightarrow$ Count $(C) \uparrow \forall j, k \in n$.

Additionally, in some implementations, the set of proposed components I implemented as a matrix. The two previous assumptions can result in an initial matrix with n columns that indicate unique proposed components and $$\frac{n(n+1)}{2}$$

columns that indicate dependencies. Then, $$\left(n + \frac{n(n+1)}{2}\right)$$

rows per sample are evaluated and weights for each of the components using multiple iterations with several samples are extracted. Weights can be a statistical correlation, or mathematical association, between a proposed component and the likelihood that the proposed component is a physical component activated by the instruction during execution. Then, a comparison 240 is performed, where weights across all the dependent components are compared, and merge or delete column based on weights. In an instance when weights between two or more columns converge or are the same, shown in FIG. 2A as 'Yes', those columns (and the associated proposed components) are merged 250 to a single column. If the weights of a column is zero, those columns are removed as the associated proposed components do not contribute to power for the given program. Also, if it is determined that the weights do not converge (i.e., 'No") the process proceeds to separate those proposed components 245 into two columns; one with the earlier scheme of counting and the other with a static value to project the variations.

In an embodiment, the comparison is performed iteratively, and the steps are repeated until converged weights are obtained and the set of components cannot merge or bifurcate any more for a given accuracy. The action of merging of dependent components can be seen as implicitly enumerating the system for probably interdependencies of components between instructions. The process of removing columns with zero weights can be thought off as pruning the set from redundant components. Lastly, the process of segregating a given non-convergent weight into multiple columns can be explained as a way of discovering components or segregating a component and its inter-relation with multiple instructions during the program execution.

Thereafter, the set of proposed components can be adjusted 255 to reflect the merging, removing, or separations performed to the matrix columns based on the compared weights. That is, a number of proposed components in the set can be changed to correspond to the deleted, or aggregated, proposed components. Subsequently, calculating an estimated number of components 260 can be accomplished, and used as a known value to replace an unknown number of physical components in the circuit. The estimation can include setting, or mapping, the estimated number of component to be correspondingly equal to the count of proposed components listed in the set after weight-based adjustments. Alternatively, the estimated number of components is not directly equal to count of proposed components, and thereby the estimation can be derived from the proposed component set using additional calculations or weights, for example. Thus, the instruction-to-component mapping technique can be used to further translate power per-instruction into a power per-component (e.g., mapping instruction counts into estimated component counts).

A minimally invasive in-situ and accurate energy per instruction (EPI) monitoring methodology can be applied. Additionally, parameters used to compute EPI can be further employed along with architectural information to extract accurate energy-per-component (EPC) in general purpose processor (GPP) based System-on-Chip (SoC), for example. Moreover, sub-component level partitioning techniques for SoC can applied in order to automatically obtain EPC, even in instances when there is limited architectural information for the system. Therefore, the embodiments can realize an integrated solution that estimates energy of software running on IC microchips, such as an FPGA, which obtains energy estimates online that can adapt to process variations and system dynamics in the presence of noise. Therefore, the power measuring techniques of the embodiments can increase the accuracy and effectiveness of energy management systems for IC system, and result in power efficiency in various power consuming applications, such as increasing the battery life in mobile systems. Furthermore, the power measurement techniques described can account for process variations and other hardware implementation parameters as it is in-situ and online. Also, a recalibration mechanism is provided that enables the measurement system to adapt to the system changes during runtime to consistently provide accurate results.

In an implementation, a minimally invasive in-situ EPI monitoring technique for FPGA based general purpose processor can be employed. The energy dissipated by the instructions of the embedded processor at runtime is estimated in a manner that can be chip specific and also features a frequent re-calibration scheme. An instruction profiler 200 can be implemented into the hardware that provides accurate instruction count during program execution in real-time. An external total energy measurement or data acquisition (DAQ) scheme can be implemented using an analog-to-digital converter. A hardware unit can be integrated into the system to acquire the total energy values from the external DAQ. Thereafter, energy weights are extracted using the instruction count values and the total measured energy. For subsequent energy per instruction (EPI) estimation, energy weights are multiplied with their corresponding instruction count value.

Figure 3:
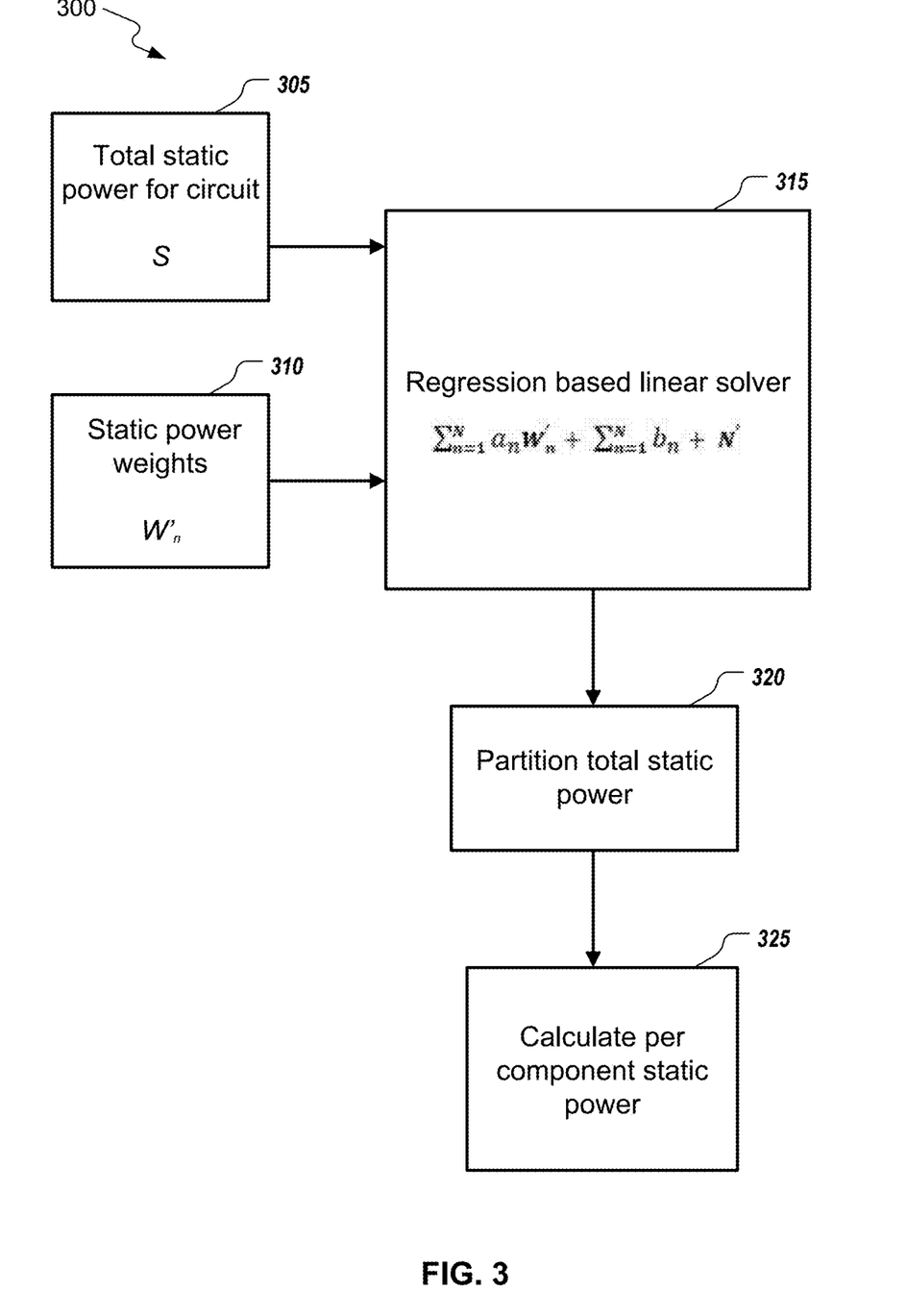
FIG. 3 shows an example of a process employed for static power partitioning.

FIG. 3 shows an example of a process employed for static power partitioning. Some existing power management systems function to sense and act over an increase in power dissipation at an IC chip at a very fine granularity and at high resolutions, so as to ensure that chips operate within the thermal budget. Thus it can become increasingly important to use a power measurement technique that provides accurate measurements of static and dynamic powers at fine grained level and high resolutions. The disclosed static power partition technique 300 can leverage the runtime dynamic power and static (e.g., power leakage) for a circuit, which can realize an accurate fine grained temperature measurement in implementation. Moreover, the static power partitioning techniques 300 described extract weight measurements in order to measure static power, and calibrate it a runtime. In contrast, current power management technologies can consider a static power component, but it is pre-computed using workload data and/or simulated results, rather than measurements. Accordingly, the embodiments can provide a technique that increases accuracy and improves overall on-chip power management capabilities.

A lump sum value associated with static power that can be dissipated from an entire chip including various components and subcomponents is considered a total static power S 305 for a circuit, and can be derived from values established during a dynamic power estimation. Some of the components and subcomponents in the circuit can have an individualized amount of static power dissipation that contributes, in summation, to the total static power S 305. The amount of dynamic power consumed on-chip can be measured at runtime for a set of instructions on an IC chip, for example. The resulting power dissipation can include multiple aspects, beyond the power consumption of active components, which can contribute to the sum for total power. As an example, a chip can experience a power consumption while there is no activity in the circuitry. Partitioning the different components of dynamic power can start from the fundamental power equation, which can be represented mathematically as $$\left(\sum_{n=1}^{N}(C_n * W_n)\right) + S + N = P_{total} \quad (1)$$

Where, $C_n$ represents activity of the nth component and $W_n$ represents the corresponding weights for the counter values, S represents static power and N represents the noise. Furthermore, the dynamic power dissipation for a chip can be partitioned, or otherwise decomposed to a component/subcomponent level. For example, a regression based liner solver can be employed to calculate a per-component dynamic power estimation using extracted dynamic power weights and circuit activity counts. Additional details regarding linear regression algorithms, weight extraction, and dynamic power partitioning are described in U.S. patent application Ser. No. 13/719,916 entitled "DIGITAL CIRCUIT POWER MEASUREMENTS USING NUMERICAL ANALYSIS", filed Dec. 19, 2012 and published on Jul. 25, 2013 as US Pub. No. 2013/0191054, which is incorporated herein by reference in its entirety. The linear regression and power weight extraction techniques described in relation to dynamic power partitioning can be further applied to the static power partitioning techniques of the embodiments. Thus, a total power consumption for a chip can characterized as the total dynamic power (e.g., sum of per-component dynamic power), a total static power S 305, and noise.

Thus, (1) can be rewritten as $$\left(P_{Total} - \left(\sum_{n=1}^{N}(C_n * W_n)\right)\right) = \sum_{n=1}^{N} S_n + N \quad (2)$$

A power behavior of a transistor over different temperature can be simulated using a simulation application, for example HSPICE. Simulation can illustrate that variation in dynamic power is proportional to temperature for a nand gate, for example. This can be attributed to increased short circuit current due to slower switching of devices when temperature increases. Also, the static power increases proportionally with temperature. This behavior is the key to monitoring static power using the weights computed from the dynamic power monitoring algorithm. Thus, weights associated with the static power can be derived, and further employed in the partitioning of static power.

Based on these observations, we can write $W_N$ and $S_N$ as, $$S_n = s_n T_n + q_n \quad (3)$$

$$W_n = \omega_n T_n + p_n \quad (4)$$

Where, $T_n$ represents the temperature, $s_n$ and $W_n$ represents weights of static and dynamic weights which change with temperature. Also, $q_n$, $p_n$ represents constants which are essentially the part of weights which are unaffected by VT changes. This can be represented mathematically as:

Rewriting (4) to find $T_n$, $$T_n = \frac{(W_n - p_n)}{\omega_n} \quad (5)$$

Thus, using (5) in (3), we get, $$S_n = s_n \cdot \left(\frac{W_n - p_n}{\omega_n}\right) + q_n \text{ OR,} \quad (6)$$

$$S_n = \frac{s_n \cdot W_n}{\omega_n} - \frac{(s_n \cdot p_n)}{\omega_n} + q_n$$

$$\text{LET, } a_n = \frac{s_n}{\omega_n} \text{ AND } b_n = q_n - \frac{(s_n \cdot p_n)}{\omega_n}$$

$$\Rightarrow S_n = a_n W_n + b_n$$

Now, $W_n$ can be normalized with $W_{n0}$ which is weight of the corresponding component when the temperature is uniform across the chip. Hence the normalized weight, $$W'_n = \frac{W_n}{W_{no}}$$

This normalized weight not only represents the differences in power dissipation per unit circuit area, it allows the algorithm to separate the changes in static power due to process variation from PVT (process variation, temperature, and voltage) since the effect of process variation does not change over time. Using this normalized weight in (6)

$$\Rightarrow S_n = \alpha_n W'_n + \beta_n \quad (7)$$

In equation 7, $\alpha_n$ represents the weight of the power mainly based on process variation, and a static power weight $W'_n$ 310 represents the changes in static power dissipations dependent on the voltage and temperature changes over time. Thereafter, $w'_n$ 310 can be applied in a first level to partition the static part of power 320 to obtain per component static power 325. Thus, through application of the computed weights, static power can be determined at the subcircuit level. In some embodiments, a regression based linear solver 315 can be applied to the derived total static power S 305 for a circuit, and using the static power weight $W'_n$ 310 as a coefficient for a moving window. The regression based linear solver 315 can be expressed as described below.

Using (7) in (2) can result in $$\left(P_{Total} - \left(\sum_{i=1}^{N}(C_n * W_n)\right)\right) = \sum_{n=1}^{N}\alpha_n W'_n + \sum_{n=1}^{N}\beta_n + N' \quad (8)$$

In the next iteration, $W_{n0}$ can be adjusted such that an does not fluctuate. Similarly, choose $$\alpha'_n = \frac{\alpha_n}{\alpha_{no}},$$

such mat.

$$\sum_{n=1}^{N}\beta_n + N' = \sum_{n=1}^{N}\alpha'_n\beta'_n + R_L \quad (9)$$

Thereafter, $\alpha'_n$ can be used in partitioning the static power 320 to that can include further partitioning $\beta_n$ to obtain per component static power which is unaffected by temperature. A resulting per component static power is calculated 325, and therefore provides monitoring of power leakage down to the component level of a chip, for example.

Moreover, rewriting (1) with (9) and (7), results in, $$P_{total} = \left(\sum_{n=1}^{N}(C_n * W_n)\right) + \sum_{n=1}^{N}\alpha_n W'_n + \sum_{n=1}^{N}\alpha'_n\beta'_n + R_L \quad (10)$$

Where the first term can indicate the dynamic power, the second component the PVT varying static power, the third a temperature variation independent static power and the last term indicates noise due to instrumentation. Furthermore, the method can be made practical for runtime applications by leveraging concepts of successive regression and estimation. For instance, the thermal/power dissipation of a circuit can be adjusted based on the temperature or power issues measured in subcircuitry. The implementation can realize a solution that eliminates the need for using complex matrix computation and large memories to store previous data, as weights are updated from using fewer predecessor values and compute results using arithmetic multiplication and addition.

Figure 4:
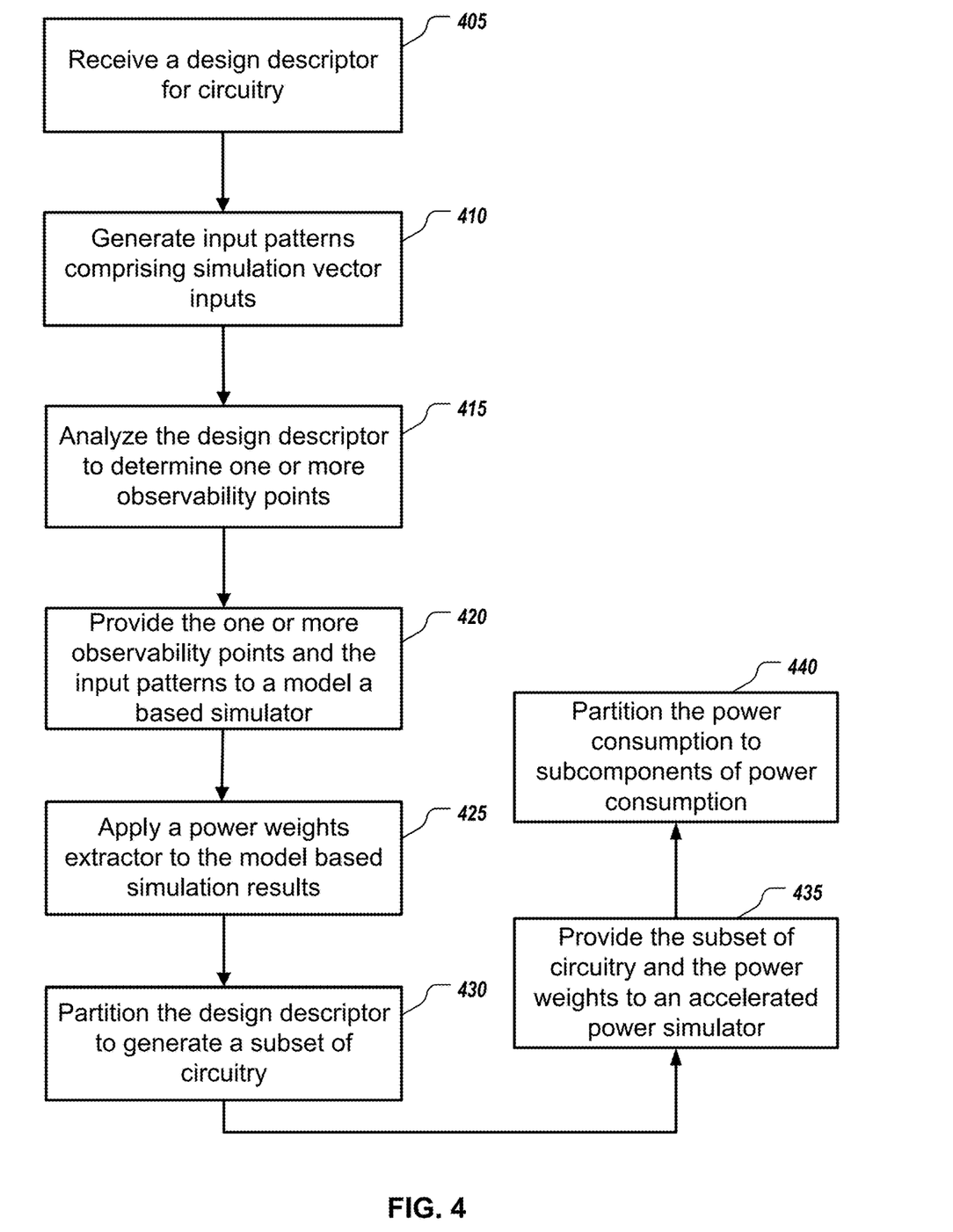
FIG. 4 shows an example of a process employed to implement accelerated power simulation techniques.

FIG. 4 shows an example of a process employed to implement accelerated power simulation techniques. The accelerated power simulation techniques can be implemented as software configured to provide accurate simulation values using the concepts of linear regression, circuit switching, and computer aided design of digital circuits. According to the embodiments, the techniques described provides an accelerated power simulation of a given cycle-accurate simulator to further provide design time power estimates at logic simulation speed. The overhead incurred is a short calibration phase using accurate technology-specific power simulation. Fast and accurate power estimates that can be realized by the techniques for subcircuits can also feed-forward into the place-and-and-route and floor-planning stages of circuit design. Using the accurate power estimates, re-configuration of the circuitry can be accomplished, for example subcircuits with higher dissipation can be placed away from each other, which in turn provide a uniform spatial temperature profile of the circuit thereby providing additional thermal operating margin.

In the implementations, the simulator can receive a design descriptor as an initial input 405. The design descriptor can be a digital design level representation for hardware circuitry. For example, the design descriptor can be received as a gate-level net list programmed, or otherwise specified, in a hardware description language (HDL) such as Verilog. Then, a test pattern generator can be employed to generate input patterns 410 in order to fully exercise the circuit. In some embodiments, the input pattern can include test vector set for a given digital logic that can cause maximum capacitance switching, for example, by causing maximum activity on the component of interest. Test vectors can be generated as the peak power consumption can be critical to the accuracy of power simulation that may further depend on maximum capacitance of switching of the components.

Subsequently, analysis can be performed on the design description 415 (e.g., net list) so as to evaluate the observability points to measure power accurately using the fine grained power monitoring approach. As an example, the logic simulation for a given circuit is annotated to collect signal transition counts, from the selected subset of wires. Therefore, the collection of activity of each wire can be performed at continuous intervals of time, and the collected activity can be stored into a file, for example that can then be employed in power simulation.

Thereafter, the observability points and the input patterns are provided to a model based simulator 420. As an example, the list of observability points can be transmitted to a model based simulator along with the test patterns. Providing the input to the model based simulator can further involve the simulator generating instantaneous total power values with the signal transitions and the various points of observation.

Power weights extractor can be applied to the results 425 generated by the model based simulator. An algorithm can be utilized to implement the extraction of power weights, which can then be used for all subsequent power measurements. The weight obtained from the simulator can be replaced with those obtained from an emulation platform, in some implementations. Accordingly, the emulation based weights can provide accurate real-time estimation of power of a target implementation. A logic analyzer can be enabled with the capability to extract power weights, so as to generate results both accurately and quickly. This method can include effects of process variations and circuit aging, by comparing weights of simulation results with those extracted from real-time implementation.

In an embodiment, the power weight extraction algorithm can be implemented as a moving linear regression based weight solver. Values of measured power and observed signal transitions can be used to solve for best fit weights over a range of observed parameters during the application of a test vector. The weights can then be employed to measure real-time power with the actual inputs to the components. In some implementations, the weights per signal transition can be derived, using C code for example, which can run after the logic simulator and uses a subset of the measured count and total power values. The weights can be used to be multiplied by transition count to extract simulated power value for each wired to be observed.

Next, the design descriptor can be partitioned so as to generate a subset of circuitry 430 and thereby further accelerating simulation. Partitioning can include identify a set of gates in the logic design that are bounded by multiple inputs to a logic that generates a single output within a level of logic; these structures are known as cones. For a given accuracy, these modules can be multiple output cones of various levels in a circuit and sensors can be added at inputs of each of these cones. The gate level circuit, for example as a Verilog net list, can be used to identify each of these cones by traversing from output to input. Initially, the level of gates in the logic are identified, the primary input being level 0 and primary output as the highest. Now, starting from primary output, traverse back by one level and all the cones between these two levels are found, or otherwise determined. Identifying cones between levels can continue iteratively until all the levels are covered. The gate feeding the primary output can be labeled as cone head as its associated fan-ins are identified. A field can be included in the gate description such that it can be used as a marker to indicate cone heads. Each of the fan-ins relevant to the cone with the name of the cone head are labeled. As the design descriptor is traversed to smaller levels, the number of levels is checked to consider for aggregation and to assign intermediate cone heads. Once all the cones are identified, their inputs are assign the digital sensors. Also, it can be ensured that there is no duplication of these sensors while still considering those wires during calculations. In each step, the number of levels are compared for each gate traversed and the process can stop if it crosses a predetermined level threshold. This provides a means to collect gates for a cone between various logic levels. Various levels can be aggregated based on the accuracy and use the final aggregation step to perform subsequent simulations.

The subset of circuitry generated from the cone based logic partitioning and the power weights can then be applied to a power simulator 435, for example SPICE models. Afterwards, the power consumption simulated by the accelerated power simulator can be further portioned into subcomponents on power consumption 440. The accelerated power simulator technique may achieve significant performance advantages over existing power modeling technologies. For instance, the embodiment may realize a 25-45 times increase in speed over some existing simulators, for example on a single server. Moreover, additional advantages associated with the accelerated power simulation techniques are readily recognized, such as automated partitioning, large system simulations, and multiple benchmark experimentation. Accordingly, accelerated power simulation as described in the embodiments can realize a solution that increases both accuracy and speed of power simulation for circuit designs.

Figure 5:
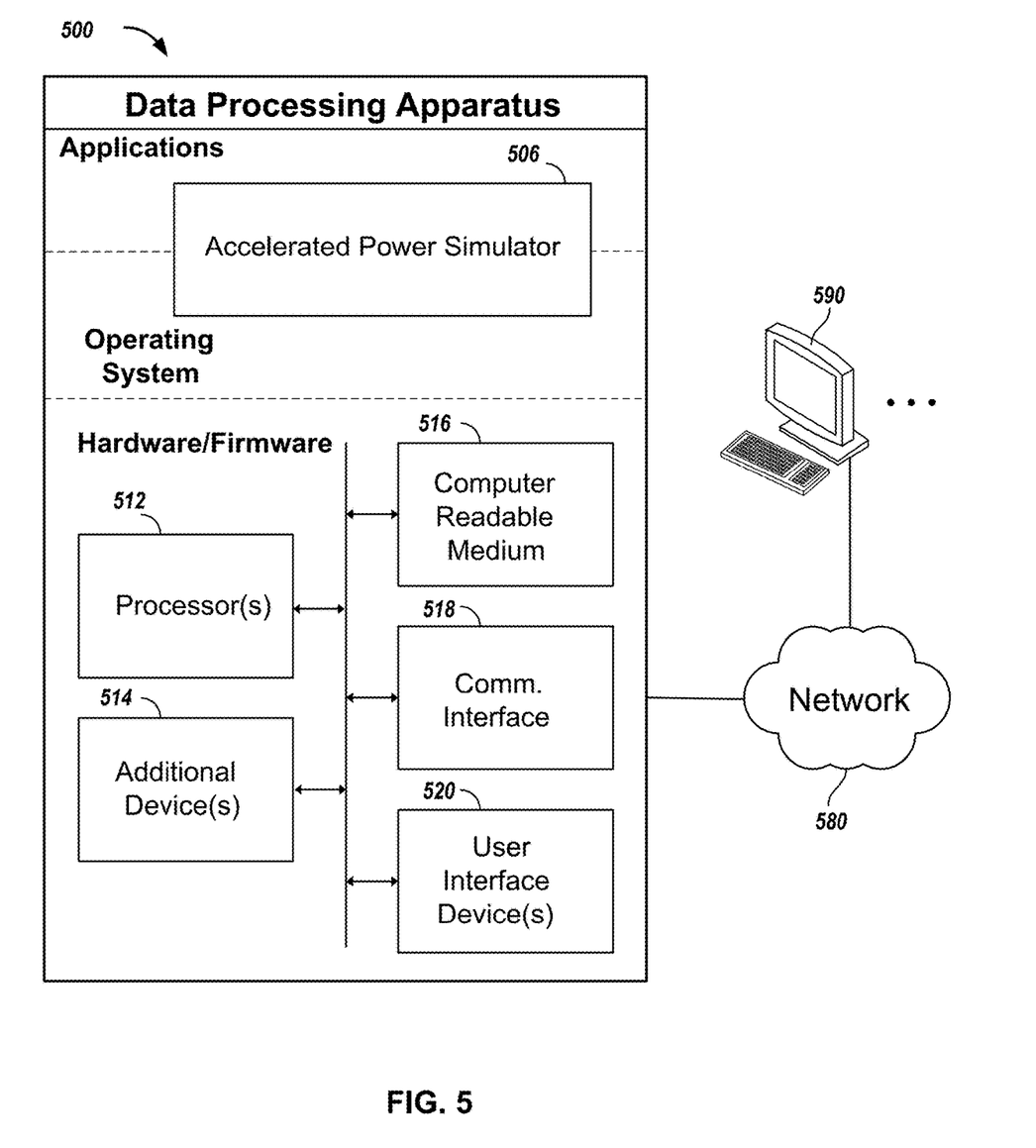
FIG. 5 is a schematic diagram of a data processing system employed to implement the accelerated power simulation techniques described.

FIG. 5 is a schematic diagram of a data processing system including a data processing apparatus 500 usable for implementing the accelerated power simulation techniques of the embodiments. The data processing apparatus 500 can be programmed as a client or as a server. The data processing apparatus 500 is connected with one or more computers 590 through a network 580. While only one computer is shown in FIG. 5 as the data processing apparatus 500, multiple computers can be used. The data processing apparatus 500 includes various software modules, which can be distributed between an applications layer and an operating system. These can include executable and/or interpretable software programs or libraries, including tools and services of an Accelerated Power Simulator 506. The Accelerated Power Simulator 506 can implement the power simulation techniques described above in reference to FIG. 4 and variations thereof. Regardless, of the operational details of the Accelerated Power Simulator 506, the number of software modules used can vary from one implementation to another. Moreover, the software modules can be distributed on one or more data processing apparatus connected by one or more computer networks or other suitable communication networks.

The data processing apparatus 500 also includes hardware or firmware devices including one or more processors 512, one or more additional devices 514, a computer readable medium 516, a communication interface 518, and one or more user interface devices 520. Each processor 512 is capable of processing instructions for execution within the data processing apparatus 500. In some implementations, the processor 512 is a single or multi-threaded processor. Each processor 512 is capable of processing instructions stored on the computer readable medium 516 or on a storage device such as one of the additional devices 514. The data processing apparatus 500 uses its communication interface 518 to communicate with one or more computers 590, for example, over a network 580. Examples of user interface devices 520 include a display, a camera, a speaker, a microphone, a tactile feedback device, a keyboard, and a mouse. The data processing apparatus 500 can store instructions that implement operations as described above, for example, on the computer readable medium 516 or one or more additional devices 514, for example, one or more of a floppy disk device, a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A computer-implemented method of extracting power-per-component information from instruction execution information for a system-on-chip, the method comprising:

receiving a plurality of instructions usable for determining a dynamic power consumed by the system-on-chip during execution of the plurality of instructions, wherein the system-on-chip comprises a plurality of physical components including at least one physical processor;

generating a set of proposed components to represent the plurality of physical components of the system-on-chip, wherein the set of proposed components comprises a respective proposed component corresponding to each instruction of the plurality of instructions;

adjusting the set of proposed components based on derived weights produced for the set of proposed components, wherein the adjusting comprises combining two or more proposed components associated with two or more of the derived weights that converge to a shared value; and determining a mapping that translates consumed power per one or more instructions into consumed power per component based on the adjusted set of proposed components and the derived weights, wherein the mapping is usable to determine a per-component dynamic power consumed by each of the plurality of physical components in the system-on-chip during the execution of the plurality of instructions.

2. The method of claim 1, wherein the derived weights indicate a statistical association between a respective one of the proposed components being activated during an execution of one or more instructions from the plurality of instructions in the system-on-chip, wherein the generating comprises including in the set of proposed components multiple proposed components corresponding to components shared by instructions, and wherein the adjusting comprises separating two or more proposed components associated with derived weights that are non-convergent.

3. The method of claim 2, wherein the adjusting comprises removing a proposed component associated with a derived weight that is equal to zero.

4. The method of claim 2, wherein the derived weights represent per-instruction dynamic power consumption that is converted to per-component dynamic power consumption in accordance with a current number of the proposed components that represent the plurality of physical components.

5. The method of claim 2, wherein the plurality of instructions comprise n instructions of an instruction set architecture (ISA) of the at least one physical processor, and the multiple proposed components corresponding to components shared by instructions comprise $$\frac{n(n+1)}{2}$$

proposed components indicating dependencies among the n instructions of the ISA.

6. The method of claim 2, comprising:
using the mapping in a computing device comprising the system-on-chip to determine the per-component dynamic power consumed by each of the plurality of physical components in the system-on-chip during the execution of the plurality of instructions in the computing device; and performing, using controller circuitry of the computing device, power and temperature management for the system-on-chip in accordance with the determined per-component dynamic power consumed by each of the plurality of physical components to efficiently use energy from a battery used to operate the system-on-chip in the computing device.

7. A non-transitory computer-readable medium encoding instructions operable to cause one or more data processing apparatus to perform operations comprising:

receiving a plurality of instructions usable for determining a dynamic power consumed by a system-on-chip during execution of the plurality of instructions, wherein the system-on-chip comprises a plurality of physical components including at least one physical processor;

generating a set of proposed components to represent the plurality of physical components of the system-on-chip, wherein the set of proposed components comprises a respective proposed component corresponding to each instruction of the plurality of instructions;

adjusting the set of proposed components based on derived weights produced for the set of proposed components, wherein the adjusting comprises combining two or more proposed components associated with two or more of the derived weights that converge to a shared value; and determining a mapping that translates consumed power per one or more instructions into consumed power per component based on the adjusted set of proposed components and the derived weights, wherein the mapping is usable to determine a per-component dynamic power consumed by each of the plurality of physical components in the system-on-chip during the execution of the plurality of instructions.

8. The non-transitory computer-readable medium of claim 7, wherein the derived weights indicate a statistical association between a respective one of the proposed components being activated during an execution of one or more instructions from the plurality of instructions in the system-on-chip, wherein the generating comprises including in the set of proposed components multiple proposed components corresponding to components shared by instructions, and wherein the adjusting comprises separating two or more proposed components associated with derived weights that are non-convergent.

9. The non-transitory computer-readable medium of claim 8, wherein the adjusting comprises removing a proposed component associated with a derived weight that is equal to zero.

10. The non-transitory computer-readable medium of claim 8, wherein the derived weights represent per-instruction dynamic power consumption that is converted to per-component dynamic power consumption in accordance with a current number of the proposed components that represent the plurality of physical components.

11. The non-transitory computer-readable medium of claim 8, wherein the plurality of instructions comprise n instructions of an instruction set architecture (ISA) of the at least one physical processor, and the multiple proposed components corresponding to components shared by instructions comprise $$\frac{n(n+1)}{2}$$

proposed components indicating dependencies among the n instructions of the ISA.

12. The non-transitory computer-readable medium of claim 8, wherein the operations comprise:

using the mapping in a computing device comprising the system-on-chip to determine the per-component dynamic power consumed by each of the plurality of physical components in the system-on-chip during the execution of the plurality of instructions in the computing device; and performing, using controller circuitry of the computing device, power and temperature management for the system-on-chip in accordance with the determined per-component dynamic power consumed by each of the plurality of physical components to efficiently use energy from a battery used to operate the system-on-chip in the computing device.

13. A computing system comprising:
a display device;
one or more input devices;
a computer coupled with the display device and the one or more input devices, the computer comprising a system-on-chip and a non-transitory memory;
wherein the system-on-chip comprises a plurality of physical components including at least one physical processor; and
wherein the non-transitory memory is configured to cause the computer to
(i) use a mapping to determine per-component dynamic power consumed by each of the plurality of physical components in the system-on-chip during execution of a plurality of instructions in the computer, wherein the mapping translates consumed power per one or more instructions into consumed power per component based on a set of determined components and derived weights, the determined components being an adjusted set of proposed components, the set of proposed components having been generated to represent the plurality of physical components of the system-on-chip, the set of proposed components comprising a respective proposed component corresponding to each instruction of the plurality of instructions, and the set of proposed components having been adjusted based on the derived weights being produced for the set of proposed components by at least combining two or more proposed components associated with two or more of the derived weights that converged to a shared value, and (ii) perform power and temperature management for the system-on-chip in accordance with the determined per-component dynamic power consumed by each of the plurality of physical components to efficiently use energy from a battery used to operate the system-on-chip in the computer.

14. The computing system of claim 13, wherein the derived weights indicate a statistical association between a respective one of the proposed components being activated during an execution of one or more instructions from the plurality of instructions in the system-on-chip, wherein the generated set of proposed components include multiple proposed components corresponding to components shared by instructions, and the set of proposed components have been adjusted by separating two or more proposed components associated with derived weights that were non-convergent.

15. The computing system of claim 14, wherein the set of proposed components have been adjusted by removing a proposed component associated with a derived weight that is equal to zero.

16. The computing system of claim 14, wherein the derived weights represent per-instruction dynamic power consumption that is converted to per-component dynamic power consumption in accordance with a current number of the proposed components that represent the plurality of physical components.

17. The computing system of claim 14, wherein the plurality of instructions comprise n instructions of an instruction set architecture (ISA) of the at least one physical processor, and the multiple proposed components corresponding to components shared by instructions comprise $$\frac{n(n+1)}{2}$$

proposed components indicating dependencies among the n instructions of the ISA.

18. The computing system of claim 14, wherein the computing system is a mobile telephone.

* * * * *